(12) United States Patent
Tanzawa

(10) Patent No.: US 9,025,385 B2  
(45) Date of Patent: *May 5, 2015

(54) VOLTAGE GENERATION AND ADJUSTMENT IN A MEMORY DEVICE

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/041,736

(22) Filed: Sep. 30, 2013

(65) Prior Publication Data

US 2014/0029349 A1    Jan. 30, 2014

Related U.S. Application Data

(63) Continuation of application No. 13/034,080, filed on Feb. 24, 2011, now Pat. No. 8,547,746.

(51) Int. Cl.

| | | |
|---|---|---|
| *G11C 11/34* | (2006.01) | |
| *G11C 16/26* | (2006.01) | |
| *G11C 5/14* | (2006.01) | |
| *G11C 16/04* | (2006.01) | |
| *G11C 16/08* | (2006.01) | |
| *G11C 16/30* | (2006.01) | |

(52) U.S. Cl.  
CPC ...... *G11C 16/26* (2013.01); *G11C 5/14* (2013.01); *G11C 16/0483* (2013.01); *G11C 16/08* (2013.01); *G11C 16/30* (2013.01)

(58) Field of Classification Search  
USPC .................................................. 365/185.18  
See application file for complete search history.

(56) References Cited

U.S. PATENT DOCUMENTS

| | | |
|---|---|---|
| 5,864,504 A | 1/1999 | Tanzawa et al. |
| 5,875,142 A | 2/1999 | Chevallier |
| 6,643,192 B2 | 11/2003 | Marotta et al. |
| 6,687,161 B2 | 2/2004 | Marotta et al. |
| 6,762,474 B1 | 7/2004 | Mills |
| 6,862,213 B2 | 3/2005 | Hamaguchi |
| 6,870,766 B2 | 3/2005 | Cho et al. |
| 7,057,958 B2 | 6/2006 | So et al. |
| 7,277,355 B2 | 10/2007 | Tanzawa |
| 7,489,556 B2 | 2/2009 | Tanzawa |
| 7,630,266 B2 | 12/2009 | Incarnati et al. |

(Continued)

OTHER PUBLICATIONS

Mincheol Park, et al., "The Effect of Negative $V$TH of NAND Flash Memory Cells on Data Retention Characteristics," IEEE EDL, vol. 30, No. 2, pp. 155-157, Feb. 2009.

(Continued)

*Primary Examiner* — Hoai V Ho  
*Assistant Examiner* — Pablo Huerta  
(74) *Attorney, Agent, or Firm* — Dicke, Billig & Czaja, PLLC

(57) ABSTRACT

Voltage generation devices and methods are useful in determining a data state of a selected memory cell in a memory device. Voltages can be generated in response to a first current and a second current. The first current is responsive to a memory device operation and a memory cell data state associated with the memory device operation, while the second current is responsive to a temperature associated with the memory device and to the memory cell data state associated with the memory device operation.

21 Claims, 12 Drawing Sheets

(56) References Cited

U.S. PATENT DOCUMENTS

| | | | |
|---|---|---|---|
| 8,547,746 B2 * | 10/2013 | Tanzawa | 365/185.18 |
| 2007/0046363 A1 * | 3/2007 | Tanzawa | 327/539 |
| 2008/0025121 A1 * | 1/2008 | Tanzawa | 365/212 |
| 2008/0137458 A1 * | 6/2008 | Yoon et al. | 365/205 |
| 2009/0003058 A1 | 1/2009 | Kang | |
| 2009/0310408 A1 | 12/2009 | Lee et al. | |
| 2010/0054068 A1 * | 3/2010 | Incarnati et al. | 365/211 |
| 2010/0074014 A1 * | 3/2010 | Dunga et al. | 365/185.17 |
| 2010/0157672 A1 | 6/2010 | Barkley | |

OTHER PUBLICATIONS

Hang-Ting Lue, et al., "Understanding STI Edge Fringing Field Effect on the Scaling of Charge-Trapping (CT) NAND Flash and Modeling of Incremental Step Pulse Programming (ISPP)," IEDM09, pp. 839-842.

\* cited by examiner

VOLTAGE GENERATION AND ADJUSTMENT IN A MEMORY DEVICE

RELATED APPLICATIONS

This application is a Continuation of U.S. application Ser. No. 13/034,080, titled "VOLTAGE GENERATION AND ADJUSTMENT IN A MEMORY DEVICE," filed Feb. 24, 2011, (allowed) which is commonly assigned and incorporated herein by reference.

TECHNICAL FIELD

The present disclosure relates generally to voltage generators and, in particular, in one or more embodiments, the present disclosure relates to non-volatile memory devices utilizing temperature adjusted voltage generators.

BACKGROUND

Voltage generators, such as generation circuits, are used in a variety of applications where constant and/or variable voltages are utilized, such as might be used in a memory device, for example. Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data state of each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory devices typically require voltage generators in order to support various memory device operations, such as programming, reading, verifying and erase operations, for example. Flash memory devices comprise semiconductor components which can be affected by variations in the operating temperature of the device. The resulting effect on the operating characteristics of the memory device may in various circumstances lead to corruption of data retrieved from the memory device, such as during a read or verify operation performed on the memory device, for example.

For the reasons stated above, and for other reasons stated below which will become apparent to those skilled in the art upon reading and understanding the present specification, there is a need in the art for voltage generators which adjust (e.g., compensate) for potential variations in operating characteristics of a memory device, such as due to changes in the operating temperature of the memory device, for example.

DETAILED DESCRIPTION

Figure 1:
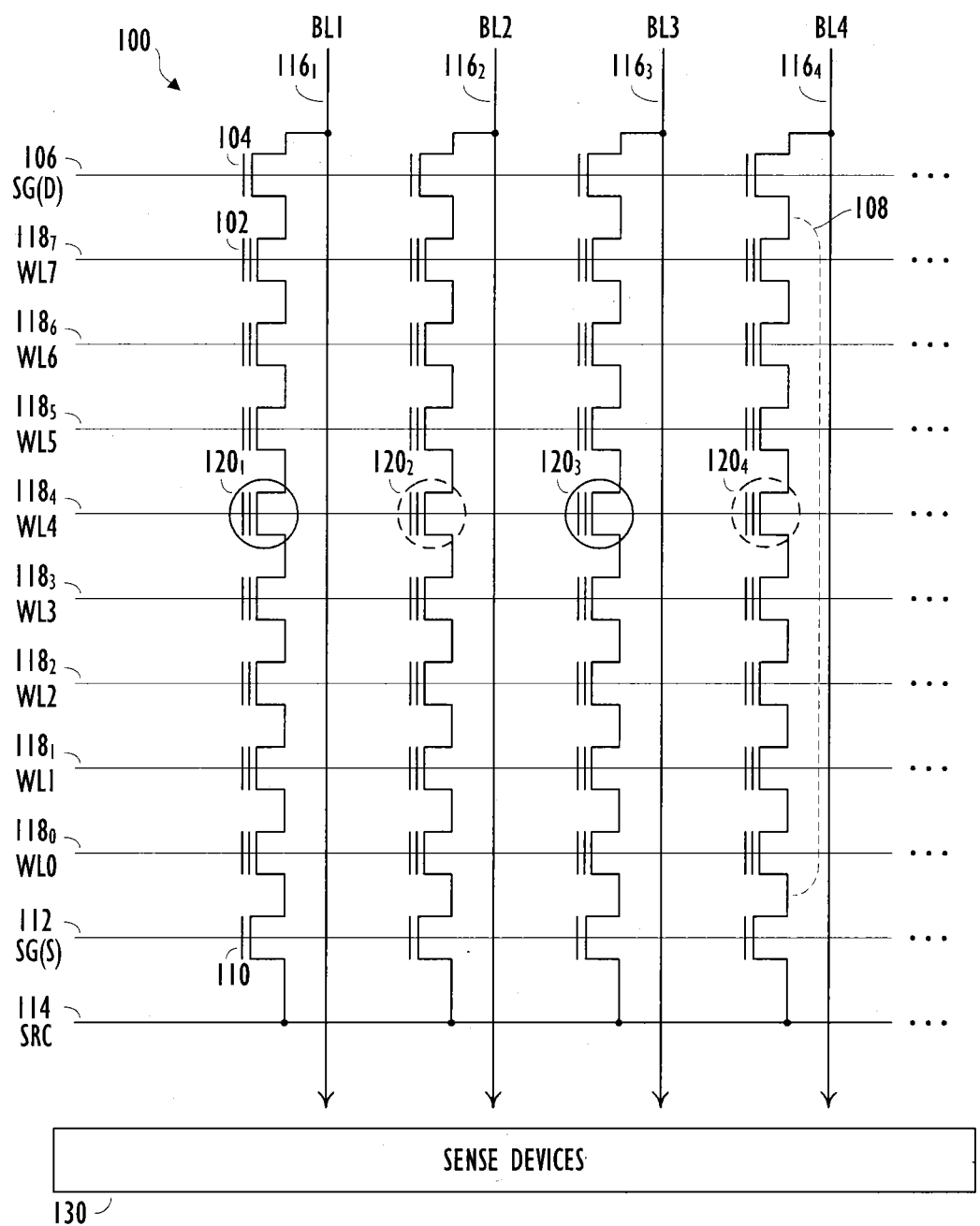
FIG. 1 shows a schematic representation of an array of NAND configured memory cells.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Flash memory typically utilizes one of two basic architectures known as NOR Flash and NAND Flash. The designation is derived from the logic used to read the devices. FIG. 1 illustrates a typical NAND type flash memory array architecture 100 wherein the memory cells 102 of the memory array are logically arranged in an array of rows and columns. In a conventional NAND Flash architecture, "rows" refers to memory cells having commonly coupled control gates 120, while "columns" refers to memory cells coupled as a particular NAND string 108, for example. The memory cells 102 of the array are arranged together in strings 108 (e.g., NAND strings), typically of 8, 16, 32, or more each. Each memory cell of a string are connected together in series, source to drain, between a source line 114 and a data line 116, often referred to as a bit line. The array is accessed by a row decoder (not shown) activating a logical row of memory cells by selecting a particular access line, often referred to as a word line, such as WL7-WL0 $118_{7\text{-}0}$, for example. Each word line is coupled to the control gates of a row of memory cells. Bit lines BL1-BL4 $116_{1\text{-}4}$ can be driven high or low depending on the type of operation being performed on the array. These bit lines BL1-BL4 $116_{1\text{-}4}$ are coupled to sense devices (e.g., sense amplifiers) 130 that detect the state of a target (e.g., selected) memory cell by sensing voltage or current on a particular bit line 116, for example. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell, depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. MLC memory cells may store even or odd numbers of bits on each memory cell. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc.

Figure 2:
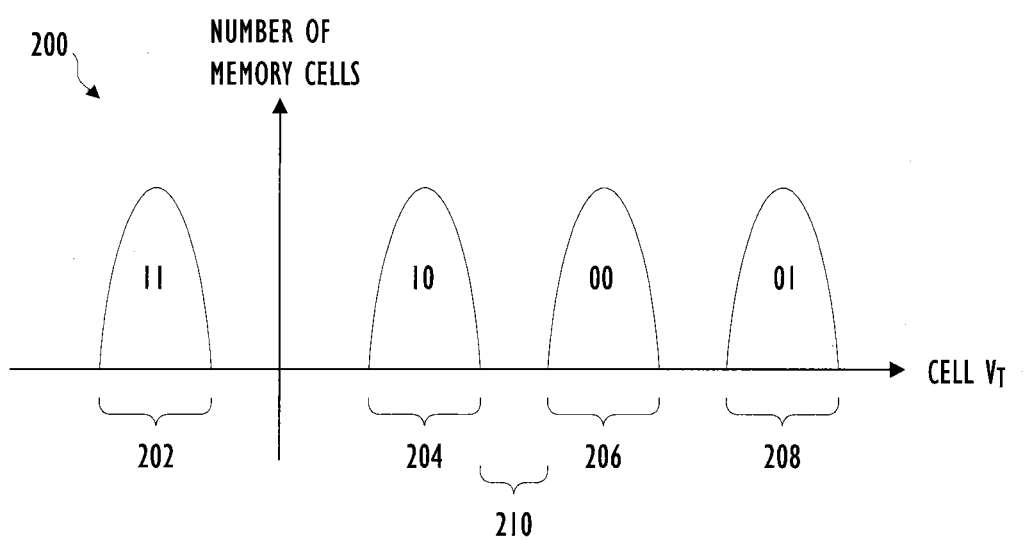
FIG. 2 shows a graphical representation of a plurality of threshold voltage ranges for a population of memory cells.

FIG. 2 illustrates an example of Vt ranges 200 for a MLC (four level) (e.g., 2-bit) memory cell. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and may have a range of 200 mV to 400 mV) is maintained between each range 202-208 to keep the ranges from overlapping. As an example, if the Vt of a memory cell is within the first of the four Vt ranges 202, the cell in this case is storing a logical '11' state and is typically considered the erased state of the cell. If the Vt is within the second of the four Vt ranges 204, the cell in this case is storing a logical '10' state. A Vt in the third Vt range 206 of the four Vt ranges would indicate that the cell in this case is storing a logical '00' state. Finally, a Vt residing in the fourth Vt range 208 indicates that a logical '01' state is stored in the cell.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells. This typically results in the Vt of memory cells residing in the Vt range 202 (e.g., erased state) of FIG. 2, for example.

Programming typically involves applying one or more programming pulses to a selected word line (e.g., WL4 $118_4$) and thus to the control gate of each memory cell $120_{1\text{-}4}$ coupled to the selected word line shown in FIG. 1. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the storage structures of memory cells targeted for programming. More specifically, the storage structures are typically charged through direct injection or Fowler-Nordheim tunneling of electrons from the channel to the storage structure, resulting in a Vt typically greater than zero in a programmed state, such as in Vt ranges 204-208 of FIG. 2, for example. In addition, an inhibit voltage is typically applied to bit lines not coupled to a NAND string containing a memory cell that is targeted (e.g., selected) for programming. Typically a verify operation is performed following each applied programming pulse to determine if the selected memory cells have achieved their target (e.g., intended) programmed state. A verify operation generally includes performing a sense operation to determine (e.g., detect) if a threshold voltage of a memory cell has reached a particular target value.

Typically, alternating bit lines are enabled $116_1, 116_3$ and/or inhibited $116_2, 116_4$ during a programming (e.g., write) and/or a read operation performed on a selected row of memory cells 120. This is illustrated by the solid and dashed circles shown around memory cells 120, for example. During a typical programming operation, some memory cells coupled to the selected word line may reach their target threshold voltage before other memory cells coupled to the same word line reach their target threshold voltages. This condition is especially likely to occur in MLC memory. For example, one or more memory cells of a particular row might have a target threshold voltage within range 204 and others may have a target threshold voltage within range 208, for example. Thus it is possible that memory cells having a target threshold voltage within range 208 will require additional programming pulses after the memory cells having a target threshold voltage within range 204 have completed programming, for example.

Figure 3:
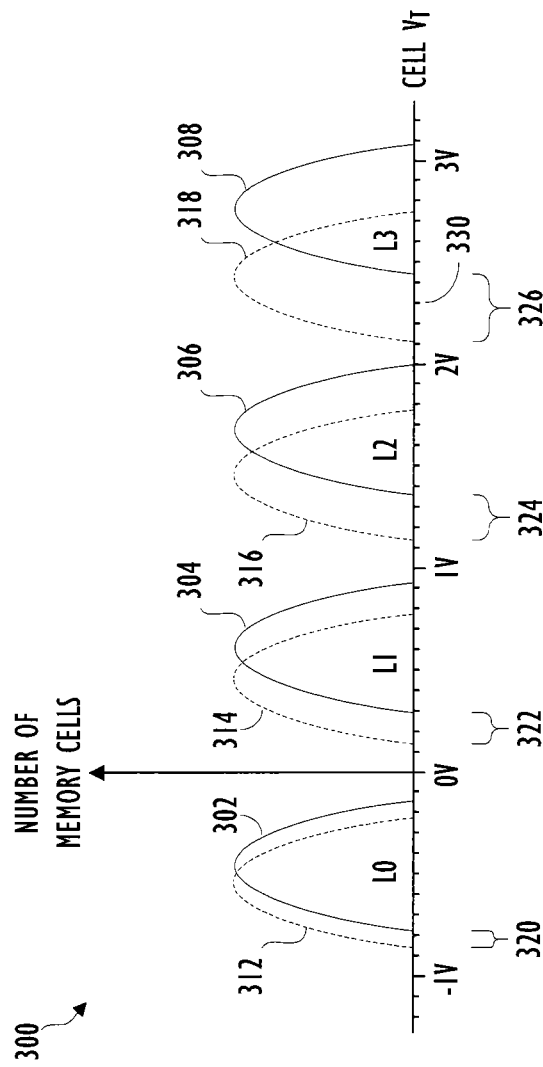
FIG. 3 shows a graphical representation of a plurality of threshold voltage ranges for a population of memory cells.

FIG. 3 illustrates an example of Vt ranges 300 for a population of MLC (four level) memory cells. Each Vt range shown in FIG. 3 is noted as L0-L3, which might correspond to data states '11'-'01', respectively, as shown in FIG. 2, for example. However, FIG. 3 further illustrates an example of how the Vt ranges for a population of memory cells might change (e.g., shift 320/322/324/326) due to a change in operating temperature of the memory cells. For example, Vt ranges 302-308 might represent Vt ranges for the memory cells operating at a first temperature. Vt ranges 312-318 might represent Vt ranges of the same memory cells operating at a second temperature which is different than the first temperature. These shifts in threshold voltages over temperature might result in read and or verify errors during operation of the device. For example, a read operation might be performed to determine (e.g., detect) if one or more selected memory cells are programmed to the data state L3. A particular read voltage 330 is applied to the selected memory cells, such as discussed above with respect to FIG. 1. For example, the read voltage 330 might be 2.3 V. No read error occurs for the memory cells having threshold voltages residing in the 308 data state as all of these memory cells exhibit threshold voltages above the read voltage 330. However, due to a change in operating temperature, some of the memory cells of population 318 are shown to exhibit threshold voltages below the read voltage 330 which may lead to read errors.

In addition to the shift of the Vt ranges of the memory device due to a change in operating temperature, FIG. 3 further illustrates that the amount of the shift may also be dependent on which data state the memory cell is in. For example, it can be seen in FIG. 3 that the amount of shift 326 for the population of memory cells programmed to data state L3 (e.g., shown as 318/308) is greater than the amount of threshold voltage shifts 320-324, for example.

Various embodiments according to the present disclosure facilitate word line voltage adjustments made in response to a temperature associated with the memory device (e.g., selected memory cells) and a particular data state to be determined (e.g., detected) from one or more selected memory cells, for example.

Figure 4:
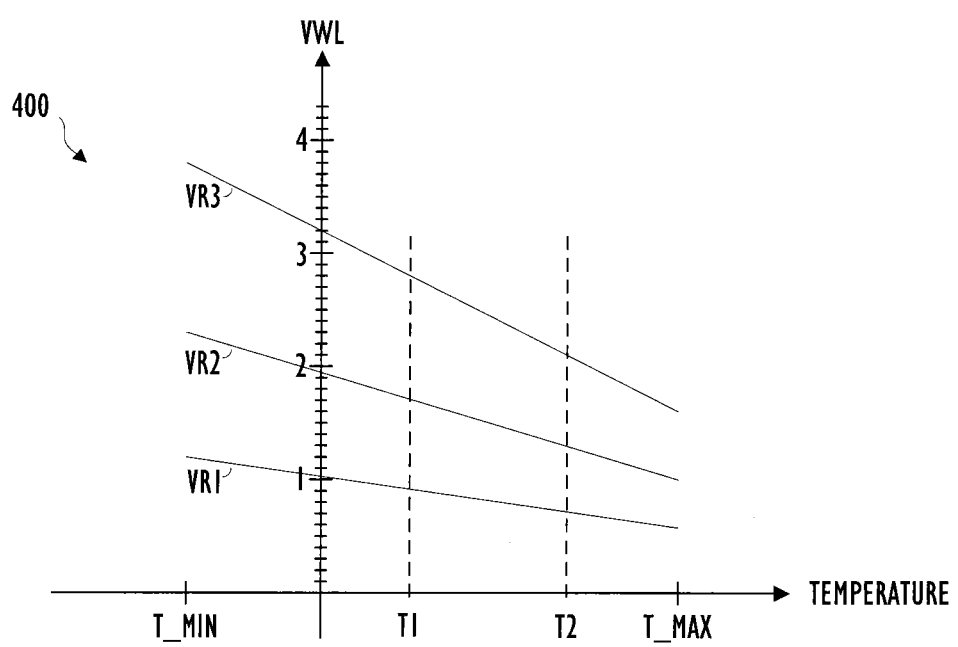
FIG. 4 shows a graphical representation of a plurality of read voltages according to an embodiment of the present disclosure.

FIG. 4 illustrates a plot of voltages according to various embodiments of the present disclosure. The voltage plots shown in FIG. 4 might be generated by an access line (e.g., word line) voltage generator and might be applied to memory cells of a selected row of memory cells, for example. Three read voltages VR1-VR3 are shown in FIG. 4. However, various embodiments according to the present disclosure are not so limited. The VR1-VR3 plots shown in FIG. 4 might be utilized with MLC (four-level) (e.g., 2-bit per cell) memory cells, for example. It should be noted further that the slope of each voltage plot might be different for one or more of the other voltage plots shown in the Figure. For example, the slope of VR3 might be greater than the slope of VR2 and the slope of VR2 might be greater than the slope of VR1, for example. Thus, the compensation of each read voltage, such as VR1-VR3, at a particular operating temperature T1, might be different than the compensation at an operating temperature T2, for example. T_MIN and T_MAX are also indicated in the Figure to facilitate a better understanding of various embodiments of the present disclosure. Values for T_MIN and T_MAX might be −40 degrees C. and +85 degrees C., respectively, for example. However, it should be noted that various embodiments according to the present disclosure are not limited to these values of T_MIN and T_MAX. The voltage plots VR1-VR3 are also shown to be linear in FIG. 4. However, one or more embodiments might include voltage plots which are non-linear, for example.

Table 1 illustrates a particular example of adjusted (e.g., compensated) word line voltages according to various embodiments and as represented by the plots shown in FIG. 4, for example. The Temperature column of Table 1 illustrates a particular range of operating temperatures of a memory device, such as a range from T_MIN to T_MAX. The Temperature value might comprise a single temperature as sensed (e.g., measured) at a single location (e.g., physical location) within the memory device. The Temperature value might alternatively comprise an average temperature value determined from a number of temperatures sensed at different locations within the memory device, for example. Temperature might be sensed prior to performing a memory device operation. For example, the Temperature value might be determined before performing an access (e.g., read and/or verify) operation on selected memory cells of the memory device. Additional embodiments might alternatively determine a Temperature value by sampling at some periodic rate, for example.

TABLE 1

| Temperature | L1 Read Voltage (VR1) | L2 Read Voltage (VR2) | L3 Read Voltage (VR3) |
|---|---|---|---|
| T_MIN | 1.2 V | 2.3 V | 3.8 V |
| T1 | 0.9 V | 1.7 V | 2.8 V |
| T2 | 0.7 V | 1.3 V | 2.1 V |
| T_MAX | 0.6 V | 1.0 V | 1.6 V |

During operation of the memory device, a number of memory cells might be selected for a memory device read operation, for example. A Temperature value is determined which might be used during the read operation. The read operation is then performed utilizing read voltages such as those shown in Table 1. For example, a read operation performed to determine whether a cell is in a L2 data state might utilize a read voltage of 1.7V when the memory device is operating at a temperature of T1. However, a read voltage of 1.3V might be used to determine whether a cell is in a L2 data state when the memory device is operating a temperature of T2. As shown by the differing slopes of the plots in FIG. 4, the amount of change in read voltages over the range of operating temperatures shown in Table 1 might vary depending on which data state the memory device is trying to determine. Thus, according to one or more embodiments, the read voltage might be adjusted in response to the operating temperature and the particular data state that the memory device is trying to determine. According to one or more embodiments, a table of temperatures and associated voltages such as Table 1, might be stored in the memory device to be referenced for determining the word line read voltage to be applied for a particular operating temperature. It should be noted that Table 1 might comprise a different number of temperature and voltage entries than those shown in the table. Table 1 might comprise many more temperature and associated voltage entries than those shown.

A number of data state compensation values might also be determined and associated with each data state to be utilized in adjusting baseline read and/or verify voltages. According to various embodiments, one or more functions (e.g., equations), such as defining the plots shown in FIG. 4, might be utilized to calculate the particular voltage to be utilized at a particular temperature. Thus, the determined data state compensation values might comprise input values for these equations according to various embodiments of the present disclosure, for example.

Various embodiments according to the present disclosure are not limited to adjusting read voltages in response to a particular operating temperature and a particular data state to be determined. Additional embodiments provide for adjusting verify voltages utilized during verify operations such as performed during a programming operation of the memory device. A table similar to Table 1 might be utilized which contains particular temperatures and associated voltages to be utilized during verify operations in the memory device, for example.

Figure 5:
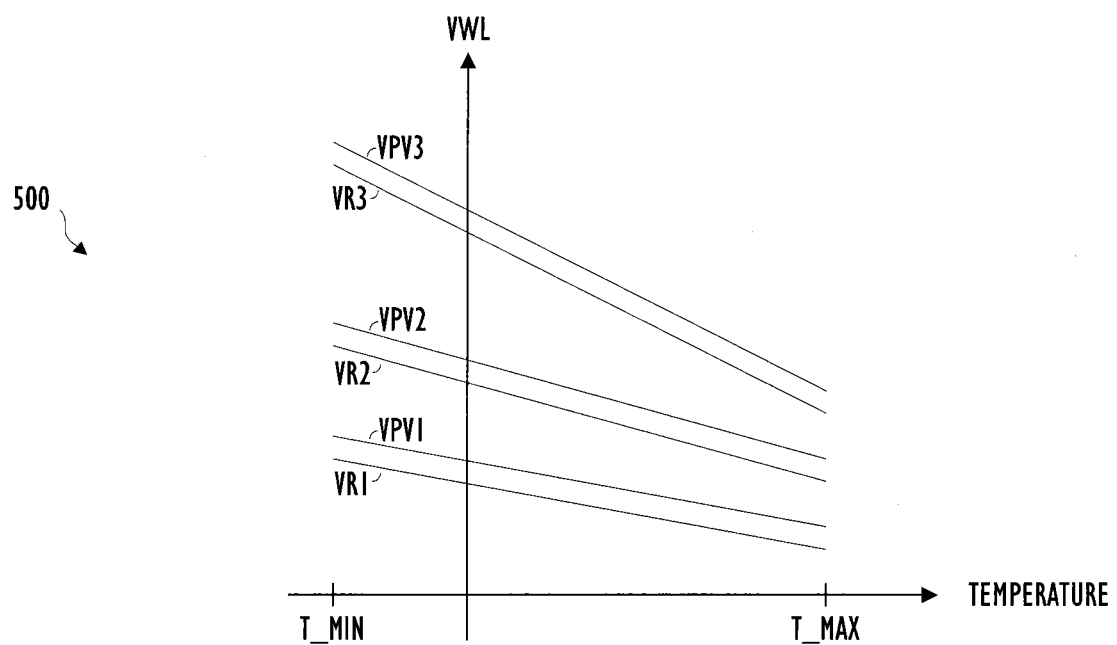
FIG. 5 shows a graphical representation of a plurality of read and verify voltages according to an embodiment of the present disclosure.

FIG. 5 illustrates a plot of read voltages VR1-VR3 according to one or more embodiments of the present disclosure and similar to the read voltages shown in FIG. 4, for example. FIG. 5 further illustrates a number of program verify voltages VPV1-VPV3, such as might be utilized between each applied programming pulse as part of a programming operation, for example. As with the read voltage plots discussed above with respect to FIG. 4 and Table 1, it should be noted that the slopes of one or more of the program verify voltage plots VPV1-VPV3 shown in FIG. 5 might be different. The slope of the VPV3 plot is greater than the slope of the VPV2 plot and the slope of the VPV2 plot is shown to be greater than the slope of the VPV1 plot, for example.

Figure 6:
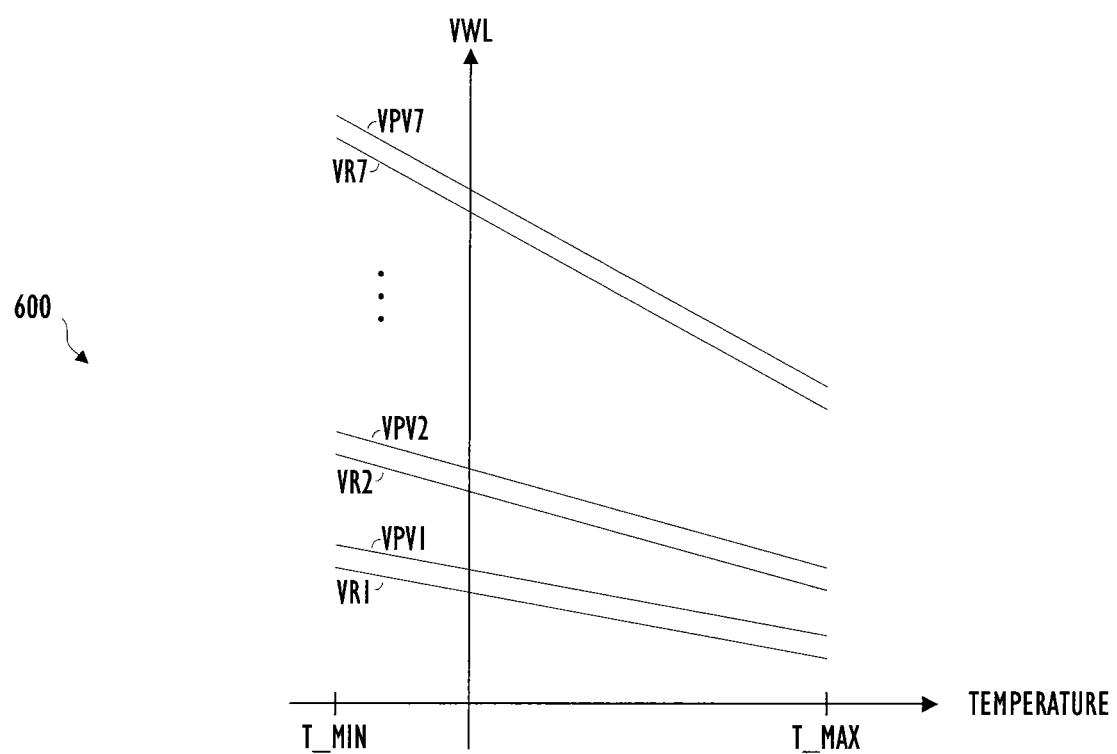
FIG. 6 shows a graphical representation of a plurality of read and verify voltages according to an embodiments of the present disclosure.

FIG. 6 illustrates additional voltage plots according to one or more embodiments of the present disclosure, such as similar to those discussed above and shown in FIGS. 4 and 5. The plots shown in FIG. 6 depict a plot of read and verify voltages to be utilized in a memory device comprising MLC (eight-level) (e.g., 3-bit per cell) memory cells, for example. Again, as discussed above with respect to FIGS. 4 and 5, the slope of one or more of the plots in FIG. 6 might each be different than the other plots shown in the Figure.

Figure 7:
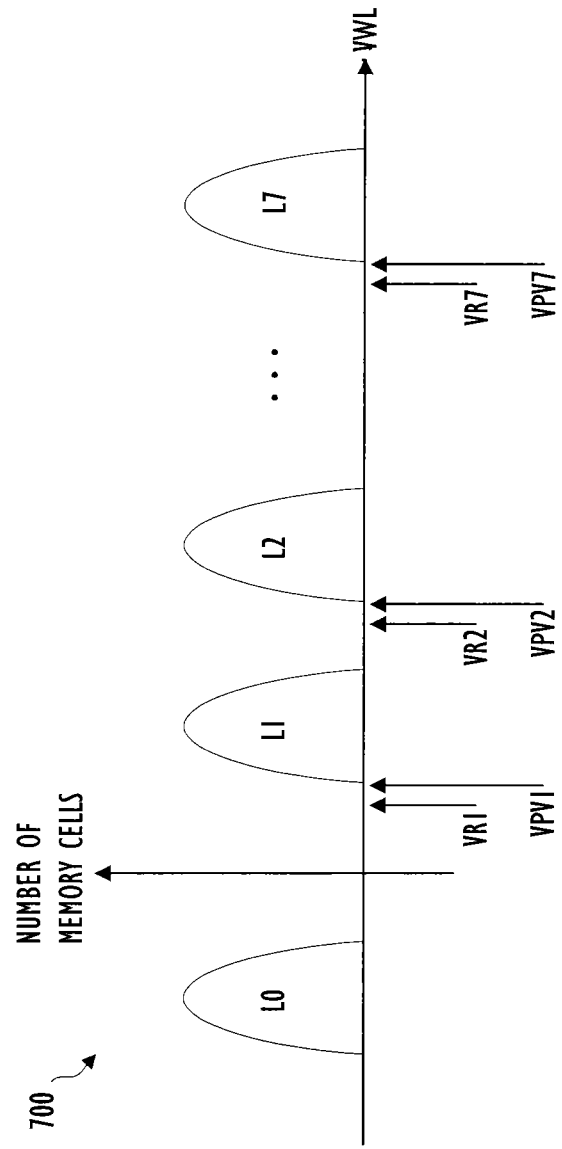
FIG. 7 shows a graphical representation of a plurality of threshold voltage ranges for a population of memory cells according to an embodiment of the present disclosure.

FIG. 7 illustrates a population of memory cells 700 in one of a plurality of data states, such as L0-L7, for example. Each read voltage VR1-VR7 and verify voltage VPV1-VPV7 shown in FIG. 7 corresponds to the respective plot shown in FIG. 6, for example. It should be noted that the x-axis VWL in FIG. 7 corresponds to the y-axis in FIG. 6. The verify voltages VPV1-VPV7 might be utilized as part of a programming operation performed on one or more memory cells of the memory device. In concurrence with the plots shown in FIG. 6, the verify voltages utilized as part of the programming operation are adjusted for both temperature of the memory cells and to which data state the selected memory cells are to be programmed to according to various embodiments of the present disclosure.

According to various embodiments of the present disclosure, each read voltage VR1-VR7 value and verify voltage VPV1-VPV7 indicated along the x-axis VWL by arrows might move (e.g., shift) (not shown) along the x-axis VWL responsive to a change in temperature associated with (e.g., within) the memory device, for example.

Figure 8:
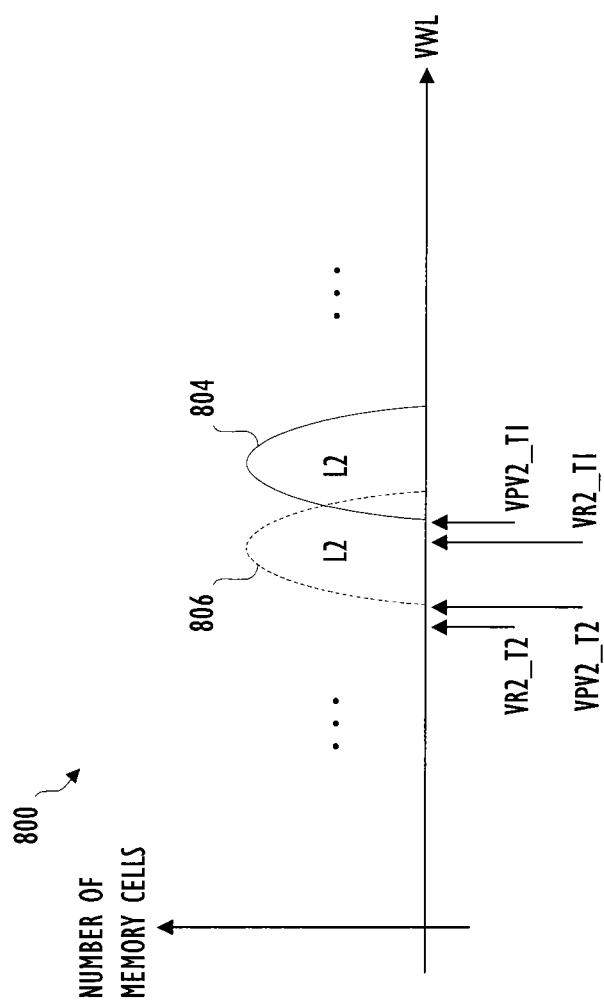
FIG. 8 shows a graphical representation of a plurality of threshold voltage ranges for a population of memory cells according to an embodiment of the present disclosure.

FIG. 8 illustrates a range of threshold voltages for a population of memory cells 800 programmed to a particular data state L2 similar to those shown in FIG. 7. Additional threshold ranges representing additional data state (e.g., such as shown in FIG. 7) have been omitted in FIG. 8. As discussed above, the threshold voltages of memory cells programmed to a particular data state might shift as a function of operating temperature. Plot 804 might represent the threshold voltages of a population of memory cells programmed to data state L2 and at a temperature of T1, for example. Plot 806 might represent the same population of memory cells programmed to data state L2 but are instead at a temperature of T2. Thus, according to various embodiments of the present disclosure, the memory device might utilize a read voltage VR2_T1 and verify voltage of VPV2_T1 in attempting to determine whether a cell is in data state L2 when the operating temperature is T1. The memory device might instead utilize a read voltage VR2_T2 and verify voltage of VPV2_T2 in attempting to determine whether a cell is in data state L2 when the operating temperature is T2 in response to the shift in threshold voltages indicated by plot 806, for example.

Figure 9:
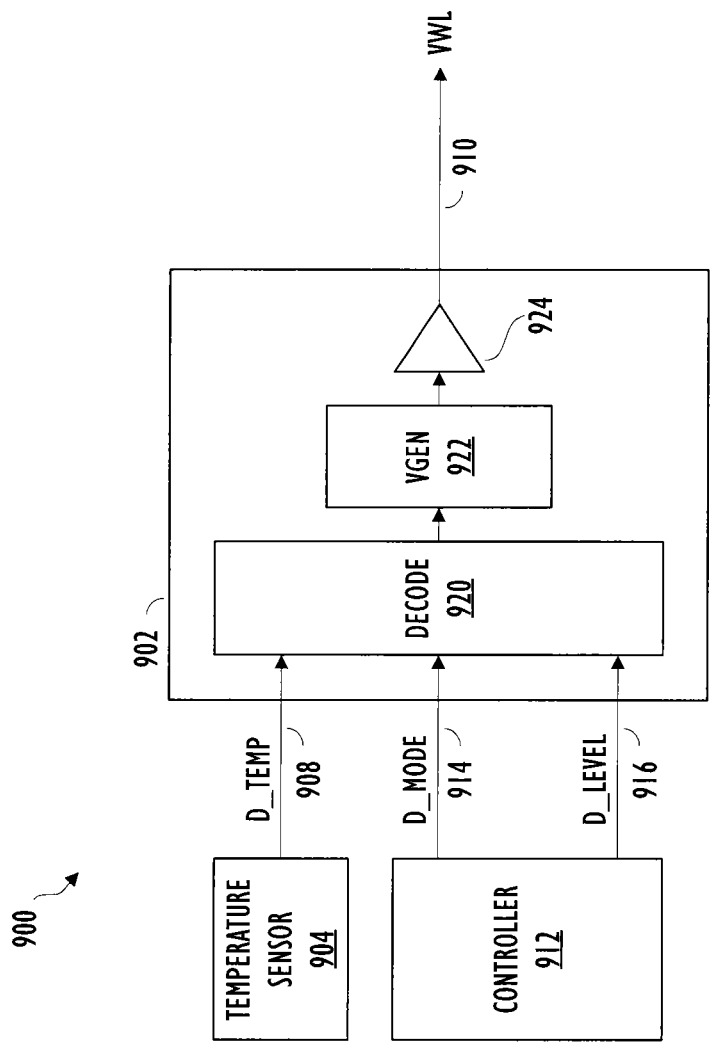
FIG. 9 shows a functional block diagram of a portion of a memory device according to an embodiment of the present disclosure.

FIG. 9 illustrates a word line voltage generator 902, controller 912 and temperature sensor (e.g., temperature sensing circuitry) 904 of a memory device 900 according to one or more embodiments of the present disclosure. The temperature sensor 904 might be configured to sense the temperature at one or more locations within the memory device. For example, one or more temperature sensing devices might be located in direct contact with the array of memory cells of the device. Multiple temperature sensing devices might be utilized such as to sense temperatures at a plurality of locations within the memory device, for example, wherein an average of these temperatures might be used to adjust the generated voltage. Examples of sensing devices might include resistive elements or transistors configured to exhibit certain thermal characteristics, for example. The temperature sensor 904 might also comprise circuitry such as analog to digital converters to convert a sensed signal from a temperature sensing device to a digital representation of the sensed temperature. The temperature sensor 904 might output a digital data D_TEMP 908 signal which comprises temperature data to the word line voltage generator 902. The temperature sensor 904 might further comprise additional circuitry, such as signal conditioning (e.g., amplifier) circuitry coupled to the temperature sensing devices. Thus, the temperature sensor might provide a temperature value that is substantially equal to the actual temperature of one or more memory cells selected for a memory device operation, for example.

Controller 912 provides the word line voltage generator 902 with data to be utilized during a memory device operation according to various embodiments of the present disclosure, such as during read and/or verify operation. For example, controller 912 might provide a D_MODE 914 signal to the word line voltage generator 902 to indicate a particular mode of operation, such as a read or verify mode of operation. The D_MODE 914 signal might comprise multiple bits of data representative of the particular mode. Controller 912 might further provide the word line voltage generator 902 with a D_LEVEL signal 916 which indicates to the voltage generator a particular data state (e.g., data states L0-L7 shown in FIG. 7) to be read and or verified in a particular memory cell of the memory array. For example, the D_LEVEL signal 916 might indicate what uncompensated (e.g., baseline) read and/or verify voltage is to be applied during the particular memory device operation. The D_LEVEL signal 916 data might comprise digital information such as an actual data value of a baseline voltage to be utilized. The D_LEVEL signal 916 might alternatively comprise data representative of a voltage to be applied to a selected word line, such as a particular count value taken from a range of possible count values representing an overall range of possible voltages which might be utilized.

The word line voltage generator 902 operates responsive to the D_TEMP data, the D_MODE data and the D_LEVEL data to output a particular word line voltage VWL on its output signal line 910 according to one or more embodiments of the present disclosure. The word line voltage generator 902 comprises decode circuitry 920, voltage generation circuitry 922 and amplification circuitry 924. The decode circuitry 920 is shown coupled to controller 912. The decode circuitry 920 interprets (e.g., decodes) the D_MODE 914 and D_LEVEL 916 signals received from the controller 912. The decode circuitry 920 further interprets the D_TEMP data received from the temperature sensor 904. Word line voltage generator 902 further comprises voltage generation circuitry VGEN 922. VGEN circuitry 922 is configured to receive signals (e.g., decoded data) from the decode circuitry 920 and to output a voltage according to various embodiments of the present disclosure, such as the voltage plots shown in FIGS. 4, 5 and 6, for example.

Figure 10:
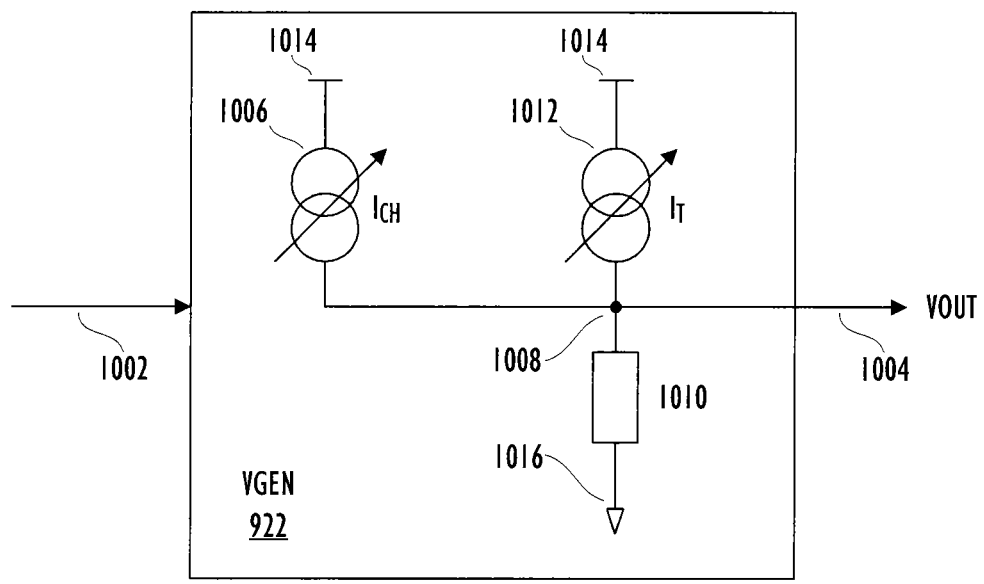
FIG. 10 shows a schematic representation of a voltage generator according to an embodiment of the present disclosure.

FIG. 10 illustrates a schematic representation showing additional detail of the voltage generation circuitry VGEN 922 shown in FIG. 9. Decoded data is received by the voltage generation circuitry VGEN 922 from the decode circuitry 920 on one or more signal lines 1002. According to various embodiments of the present disclosure, the voltage generation circuitry VGEN 922 comprises a first adjustable current source $I_{CH}$ 1006 shown coupled between a voltage source 1014 (e.g., Vcc) and a node 1008. The voltage generation circuitry further comprises a second adjustable current source $I_T$ 1012 which is shown coupled between the voltage source 1014 and the node 1008. Voltage converter circuitry 1010 is also shown which is configured to establish a voltage (e.g., output voltage) on the node 1008 responsive to the currents sourced by the first and the second adjustable current sources. The voltage converter 1010 is coupled between the node 1008 and a reference source 1016, such as a ground reference, for example. The voltage converter circuitry 1010 might comprise one or more of a number of elements having a particular resistive characteristic. The voltage converter might comprise a resistor and/or a transistor element configured to maintain a particular resistance value between the node 1008 and the ground reference 1016, for example. The voltage established on the node 1008 is output from the VGEN circuitry 922 on the VOUT signal line 1004.

The first adjustable current source $I_{CH}$ 1006 is configured to source a current responsive to a particular mode of operation and/or a particular data state to be determined as part of a memory device operation. For example, it might be desired to perform a verify operation on a selected memory cell which is to be programmed to a data state L2, such as shown in FIG. 7, for example. Thus, the current source $I_{CH}$ 1006 is configured to source a current corresponding to a verify mode of operation and a data state of L2. For example, the current source $I_{CH}$ 1006 might source a current corresponding to an unadjusted verify voltage (e.g., baseline voltage) to be applied to a memory cell to be programmed to a data state L2. The second adjustable current source $I_T$ 1012 sources a current responsive to a sensed temperature of the memory device and to the particular data state to be verified. Thus, the two current sources 1006/1012 coupled to node 1008 each source a current which along with voltage converter 1010 establishes an output voltage as a function of data state to be determined and a temperature associated with the memory device according to one or more embodiments of the present disclosure.

Referring back to FIG. 9, the word line voltage generator 902 might also comprises additional circuitry, such as amplifier circuitry 924, for example. Amplifier circuitry 924 might comprise a unity gain amplifier circuit to serve as driver circuitry for the signal provided to it by the output VOUT 1004 signal line shown in FIG. 10, for example. The output voltage of amplifier circuitry 924 is then applied to a selected word line of the memory device, such as during a memory device operation, for example. Additional embodiments might comprise different amplifier circuitry 924 that have fixed and/or adjustable output gain and drive characteristics, for example.

Figure 11:
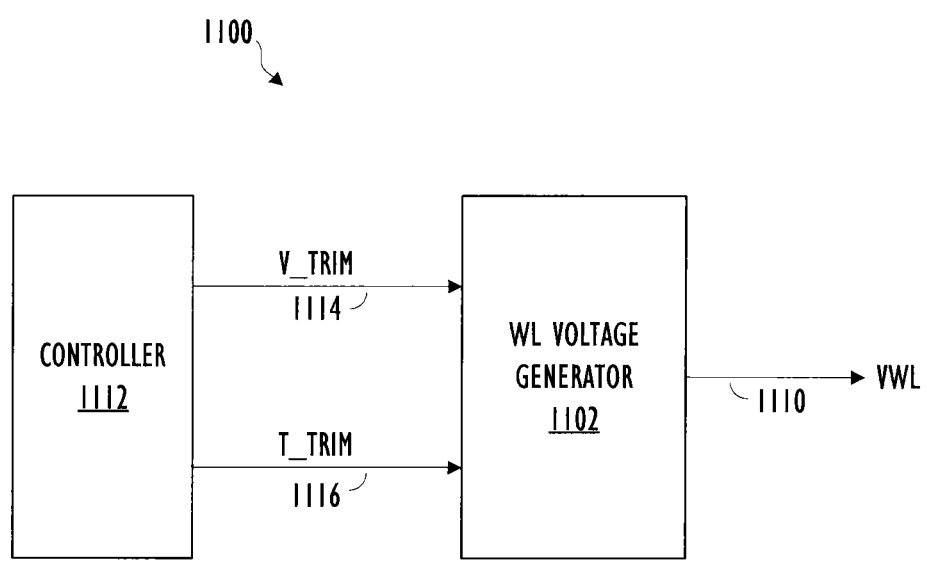
FIG. 11 shows a functional block diagram of a portion of a memory device according to an embodiment of the present disclosure.

FIG. 11 illustrates a controller 1112 and a word line voltage generator 1102 of a memory device according to one or more embodiments of the present disclosure. Controller 1112 provides the word line voltage generator 1102 with information relating to a memory device operation to be performed, such as a read or verify operation. The controller provides a V_TRIM signal 1114 which supplies an uncompensated (e.g., baseline) voltage corresponding to a read voltage and/or verify voltage for each data state of the memory cells of the memory device, such as a baseline value for VR1-VR7 and VPV1-VPV7 as shown in FIG. 7, for example. Read and verify baseline voltages might comprise a particular voltage corresponding to a particular baseline temperature of the memory device. An adjusted read and/or verify voltage, e.g., comprising the baseline plus an offset, might be determined as a function of the delta between the actual temperature of the memory device and the baseline temperature and baseline voltage according to one or more embodiments of the present disclosure, for example.

The controller 1112 also provides a T_TRIM signal 1116 which provides the word line voltage generator 1102 with information regarding compensation of the baseline voltages (e.g., V_TRIM data 1114) with temperature data associated with the memory device. One or both of the received V_TRIM signals and the T_TRIM signals might comprise digital information representative of the baseline voltages and the temperature data. However, one or both of the received V_TRIM signals and the T_TRIM signals might also comprise analog representations of the baseline voltages and the temperature of the memory device, for example.

Although not shown in FIG. 11, the word line voltage generator 1102 might comprise one or more of the decode circuitry 920, voltage generation circuitry 922 and amplifier circuitry 924 such as shown in FIG. 9. The voltage generator 1102 drives the word line voltage generator output 1110 with a word line voltage to comport with the plots shown in FIGS. 4, 5 and 6, for example.

Figure 12:
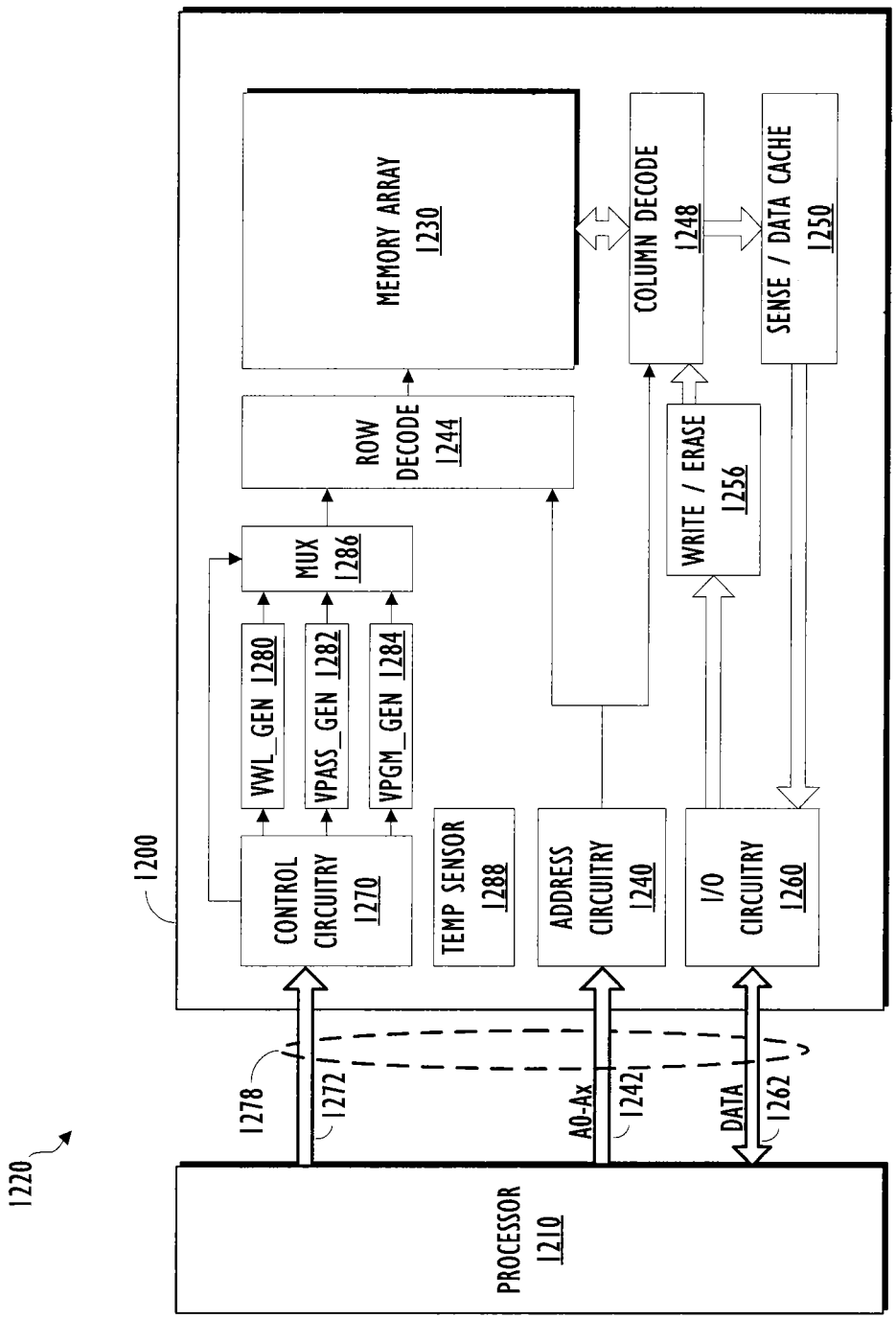
FIG. 12 shows a functional block diagram of an electronic system according to an embodiment of the present disclosure.

FIG. 12 illustrates a functional block diagram of an electronic system having at least one memory device incorporating at least one word line voltage generator according to various embodiments of the present disclosure. The memory device 1200 illustrated in FIG. 12 is coupled to a memory access device such as a processor 1210. The processor 1210 might be a microprocessor or some other type of controlling circuitry. The memory device 1200 and the processor 1210 form part of an electronic system 1220. The memory device 1200 has been simplified to focus on features of the memory device that are helpful in understanding various embodiments of the present disclosure.

The memory device 1200 includes one or more arrays of memory cells 1230 that might each be logically arranged in rows and columns. Memory array 1230 may comprise single level and/or multi-level Flash memory cells, for example. The memory array 1230 might include multiple banks and blocks of memory cells residing on a single or multiple die as part of the memory device 1200. One or more temperature sensors (e.g., temperature sensing circuitry) 1288, such as those discussed above with respect to FIG. 9, might be coupled (not shown) to memory array 1230 and/or other locations in the memory device to sense a temperature(s) at one or more locations within the memory device, for example.

An address buffer circuit 1240 is provided to latch address signals provided on address input connections A0-Ax 1242. Address signals are received and decoded by row decode circuitry 1244 and column decode circuitry 1248 to access the memory array 1230. It will be appreciated by those skilled in the art, with the benefit of the present description, that the number of address input connections 1242 might depend on the density and architecture of the memory array 1230. That is, the number of address digits increases with both increased memory cell counts and increased bank and block counts, for example. Data input and output buffer circuitry 1260 is included for bi-directional data communication over a data bus 1262 with the processor 1210. The address 1242 and data busses 1262 might each be a discrete signal or might be comprised of multiple signals, for example.

The memory device 1200 accesses data in the memory array 1230 by sensing voltage or current changes in the memory array using sense/data cache circuitry 1250. The sense/data cache circuitry 1250, in at least one embodiment, is coupled to read and latch a row of data from the memory array 1230. Write/erase circuitry 1256 is provided to facilitate writing data to and/or erasing data from the memory array 1230.

Various voltages are utilized by the memory device 1200 to facilitate memory device operations, such as reading, verifying, writing (e.g., programming) and erase operations according to various embodiments of the present disclosure. Memory device 1200 comprises voltage generators 1280-

1284 to generate various voltages to perform these memory device operations. VPGM_GEN 1284 comprises circuitry to generate programming voltages. VPASS_GEN 1282 comprises circuitry to generate pass voltages (e.g., Vpass voltages) to operate memory cells coupled to unselected word lines in pass through modes regardless of their data state, such as during read and verify operations, for example. VWL_GEN 1280 comprises circuitry configured to facilitate word line voltage adjustment as discussed above according to various embodiments of the present disclosure. VWL_GEN 1280 circuitry might comprise the word line voltage generator 902 discussed above with respect to FIG. 9, for example.

MUX 1286 illustrated in FIG. 12 might be configured to direct the appropriate voltages to word lines of the memory array 1230 responsive to a particular memory device operation to be performed. For example, during a read operation of the memory array 1230, the MUX 1286 is configured to couple Vpass voltages to unselected word lines and to couple a read voltage, such as generated by VWL_GEN 1280, to a selected word line. MUX 1286 might also be incorporated into the row decode circuitry 1244 according to one or more embodiments of the present disclosure.

A controller, such as control circuitry 1270 is configured at least in part to interface with the word line voltage generator VWL_GEN 1280 according to various embodiments of the present disclosure. For example, control circuitry 1270 might provide the D_MODE 914 and the D_LEVEL 916 signals discussed with respect to FIG. 9 to the word line voltage generator VWL_GEN 1280 according to various embodiments of the present disclosure. According to additional embodiments, control circuitry 1270 might provide word line voltage generator VWL_GEN 1280 with the V_TRIM 1114 and the T_TRIM 1116 signals discussed with respect to FIG. 11, for example. In at least one embodiment, the control circuitry 1270 may utilize a state machine. Control circuitry 1270 might direct additional operations within the memory device 1200, such as control of the MUX 1286, VPASS_GEN circuitry 1282 and VPGM_GEN circuitry 1284, for example.

Control signals and commands can be sent by the processor 1210 to the memory device 1200 over the command bus 1272. The command bus 1272 might be a discrete signal or may be comprised of multiple signals, for example. These command signals 1272 are used to control various memory device operations on the memory array 1230, such as reading, verifying, writing (e.g., programming) and erase operations. The command bus 1272, address bus 1242 and data bus 1262 might all be combined or might be combined in part to form a number of standard interfaces 1278. For example, the interface 1278 between the memory device 1200 and the processor 1210 may be a Universal Serial Bus (USB) interface. The interface 1278 might also be a standard interface used with many hard disk drives (e.g., SATA, PATA) as are known to those skilled in the art.

The electronic system illustrated in FIG. 12 has been simplified to facilitate a basic understanding of the features of the memory and is for purposes of illustration only. A more detailed understanding of internal circuitry and functions of non-volatile memories are known to those skilled in the art.

CONCLUSION

In summary, temperature adjustment methods according to one or more embodiments of the present disclosure can, for example, facilitate a more robust retrieval of data stored in a memory device. Various embodiments further provide memory devices configured to adjust various voltages, such as read and verify voltages, responsive to a temperature associated with the memory device along with a particular data state to be determined in selected memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
   an array of memory cells; and
   a voltage generator comprising a first adjustable current source for sourcing a first current and a second adjustable current source for sourcing a second current, wherein the voltage generator is configured to supply an access line voltage to an access line of the array of memory cells responsive to the first current and the second current;
   wherein the first adjustable current source is responsive to data indicative of a selected mode of operation of the memory device and data indicative of a memory cell data state associated with the selected mode of operation; and
   wherein the second adjustable current source is responsive to data indicative of a temperature associated with the memory device and to the data indicative of the memory cell data state.

2. The memory device of claim 1, wherein the memory cell data state associated with the selected mode of operation is a particular data state of a plurality of data states.

3. The memory device of claim 1, wherein the temperature associated with the memory device comprises a temperature substantially equal to a temperature of the selected memory cell.

4. The memory device of claim 1, wherein the temperature associated with the memory device comprises an operating temperature of the memory device.

5. The memory device of claim 1, wherein the temperature associated with the memory device comprises an average of a plurality of temperatures associated with the memory device.

6. The memory device of claim 1, further comprising:
   wherein the first adjustable current source is coupled between a first voltage source and a particular node, and wherein the first adjustable current source is coupled to source the first current to the particular node; and
   wherein the second adjustable current source is coupled between a second voltage source and the particular node, and wherein the second adjustable current source is coupled to source the second current to the particular node.

7. The memory device of claim 6, further comprising:
   a voltage converter coupled between a third voltage source and the particular node, wherein the voltage converter is configured to establish a particular voltage on the particular node responsive to the first current and the second current.

8. The memory device of claim 7, wherein the first voltage source and the second voltage source each comprise a supply voltage source, and wherein the third voltage source comprises a ground reference source.

9. The memory device of claim 7, wherein the voltage converter comprises a circuit element having a particular resistive characteristic configured to establish the particular voltage on the particular node.

10. The memory device of claim 7, further comprising:
an amplifier circuit having an input coupled to the particular node and having an output to provide the access line voltage.

11. The memory device of claim 10, wherein the amplifier circuit is a unity gain amplifier.

12. A memory device, comprising:
an array of memory cells;
a voltage generator, wherein the voltage generator comprises:
a first adjustable current source coupled to receive a supply voltage and coupled to source a first current to an output node, wherein a level of the first current is responsive to a signal indicative of a selected memory device operation and a signal indicative of a memory cell data state associated with the selected memory device operation;
a second adjustable current source coupled to receive the supply voltage and coupled to source a second current to the output node, wherein a level of the second current is responsive to a signal indicative of a temperature associated with the memory device and to the signal indicative of the memory cell data state associated with the selected memory device operation;
a voltage converter coupled between the output node and a reference potential node, wherein the voltage converter is configured to establish a particular voltage on the output node responsive to the first current and the second current; and
wherein the voltage generator is configured to generate a voltage in response to the particular voltage and to apply the generated voltage to a selected access line of the array of memory cells for the selected memory device operation.

13. The memory device of claim 12, wherein the selected memory device operation comprises a read operation and the memory cell data state associated with the selected memory device operation is a data state to be sensed by the read operation.

14. The memory device of claim 12, wherein the selected memory device operation comprises a verify operation and the memory cell data state associated with the selected memory device operation is a data state to be sensed by the verify operation.

15. The memory device of claim 12, wherein, for a particular memory cell data state associated with the selected memory device operation, the first current has a first level when the selected memory device operation is a read operation and the first current has a second level different than the first level when the selected memory device operation is a verify operation.

16. The memory device of claim 12, wherein, for a particular selected memory device operation, the first current has a first level when the memory cell data state associated with the selected memory device operation is a particular data state of a plurality of data states associated with the selected memory device operation, and the first current has a second level different than the first level when the memory cell data state associated with the selected memory device operation is another data state of the plurality of data states.

17. The memory device of claim 12, wherein, for a particular temperature associated with the memory device, the second current has a first level when the memory cell data state associated with the selected memory device operation is a particular data state of a plurality of data states associated with the selected memory device operation, and the second current has a second level different than the first level when the memory cell data state associated with the selected memory device operation is another data state of the plurality of data states.

18. The memory device of claim 12, wherein, for a particular memory cell data state associated with the selected memory device operation, the second current has a first level when the temperature associated with the memory device has a first value, and the second current has a second level different than the first level when the temperature associated with the memory device has a second value different than the first.

19. A method of determining whether a selected memory cell is in a particular data state of a plurality of data states, the method comprising:
determining a temperature associated with the selected memory cell;
generating an indication of the temperature associated with the selected memory cell;
generating an indication of the particular data state;
generating an indication of a particular mode of operation being used to determine whether the selected memory cell is in the particular data state;
generating a first current responsive to the indication of the particular data state and to the indication of the particular mode of operation being used to determine whether the selected memory cell is in the particular data state, and sourcing the first current to a node;
generating a second current responsive to the indication of the particular data state and to the indication of the temperature associated with the selected memory cell, and sourcing the second current to the node;
generating a voltage at the node responsive to the first current and the second current; and
applying a voltage to an access line associated with the selected memory cell in response to the voltage generated at the node.

20. The method of claim 19, wherein applying a voltage to an access line associated with the selected memory cell in response to the voltage generated at the node comprises amplifying the voltage generated at the node.

21. The method of claim 20, wherein amplifying the voltage generated at the node comprises amplifying the voltage generated at the node using a unity gain amplifier.

* * * * *